(12) United States Patent
Lee et al.

(10) Patent No.: US 10,361,078 B2
(45) Date of Patent: Jul. 23, 2019

(54) METHOD OF FORMING FINE PATTERNS OF A SEMICONDUCTOR DEVICE

(71) Applicant: SAMSUNG ELECTRONICS CO., LTD., Suwon-si, Gyeonggi-do (KR)

(72) Inventors: Yil-hyung Lee, Hwaseong-si (KR); Jongchul Park, Seongnam-si (KR); Jong-Kyu Kim, Seongnam-si (KR); Jongsoon Park, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 7 days.

(21) Appl. No.: 15/661,418

(22) Filed: Jul. 27, 2017

(65) Prior Publication Data
US 2018/0182623 A1 Jun. 28, 2018

(30) Foreign Application Priority Data

Dec. 22, 2016 (KR) .................. 10-2016-0177024

(51) Int. Cl.
*H01L 21/033* (2006.01)
*H01L 21/263* (2006.01)
*H01L 21/311* (2006.01)

(52) U.S. Cl.
CPC ........ *H01L 21/0337* (2013.01); *H01L 21/263* (2013.01); *H01L 21/31116* (2013.01)

(58) Field of Classification Search
CPC ........... H01L 21/0337; H01L 21/31116; H01L 21/31144; H01L 21/32139; H01L 21/0217; H01L 21/31056; H01L 21/76811; H01L 21/68764; H01L 21/0338
See application file for complete search history.

(56) References Cited

U.S. PATENT DOCUMENTS

| | | | |
|---|---|---|---|
| 9,166,154 B2 | 10/2015 | Satoh et al. | |
| 9,218,969 B2 | 12/2015 | Kim et al. | |
| 9,257,637 B2 | 2/2016 | Guo | |
| 2006/0201912 A1 | 9/2006 | Koo | |
| 2011/0132754 A1* | 6/2011 | Shirotori ............... B82Y 10/00 |
| | | | 204/297.05 |
| 2015/0287911 A1 | 10/2015 | Kim et al. | |
| 2016/0222521 A1 | 8/2016 | Chae et al. | |

FOREIGN PATENT DOCUMENTS

KR 10-2009-0016843 A 2/2009

* cited by examiner

*Primary Examiner* — Jasmine J Clark
(74) *Attorney, Agent, or Firm* — Lee & Morse, P.C.

(57) ABSTRACT

A method of forming fine patterns includes forming an upper mask layer on a substrate, forming preliminary mask patterns on the upper mask layer, and forming upper mask patterns by etching the upper mask layer using the preliminary mask patterns as etch masks. Forming the upper mask patterns includes etching the upper mask layer by performing an etching process using an ion beam. The upper mask patterns include a first upper mask pattern formed under each of the preliminary mask patterns, and a second upper mask pattern formed between the preliminary mask patterns in a plan view and spaced apart from the first upper mask pattern.

20 Claims, 16 Drawing Sheets

METHOD OF FORMING FINE PATTERNS OF A SEMICONDUCTOR DEVICE

CROSS-REFERENCE TO RELATED APPLICATION

Korean Patent Application No. 10-2016-0177024, filed on Dec. 22, 2016, in the Korean Intellectual Property Office, and entitled: "Method of Forming Fine Patterns of a Semiconductor Device," is incorporated by reference herein in its entirety.

BACKGROUND

1. Field

Embodiments relate to a method of forming fine patterns of a semiconductor device and, more particularly, to a method of forming fine patterns by using an ion beam etching method.

2. Description of the Related Art

Fine patterns may be necessary to manufacture a highly integrated semiconductor device. To integrate a lot of elements in a small area, an individual element should be formed as small as possible. To achieve this, a pitch of desired patterns should be reduced. The pitch may correspond to a sum of a width of each pattern and a distance between the patterns. Recently, design rules of semiconductor devices have been significantly reduced. However, the formation of patterns having a fine pitch may be difficult due to a resolution limitation of a photolithography process.

SUMMARY

In an aspect, a method of forming fine patterns may include forming an upper mask layer on a substrate, forming preliminary mask patterns on the upper mask layer, and forming upper mask patterns by etching the upper mask layer using the preliminary mask patterns as etch masks. Forming the upper mask patterns may include etching the upper mask layer by performing an etching process using an ion beam. The upper mask patterns may include a first upper mask pattern formed under each of the preliminary mask patterns, and a second upper mask pattern formed between the preliminary mask patterns in a plan view and spaced apart from the first upper mask pattern.

In an aspect, a method of forming fine patterns may include forming an upper mask layer on a substrate, forming preliminary mask patterns on the upper mask layer, and forming upper mask patterns by etching the upper mask layer using the preliminary mask patterns as etch masks. Forming the upper mask patterns may include etching the upper mask layer by performing an etching process using an ion beam. An incident angle of the ion beam may be controlled during the etching process in such a way that the upper mask layer has a shaded area to which the ion beam is not irradiated between the preliminary mask patterns.

In an aspect, a method of forming fine patterns may include forming an upper mask layer on a substrate, forming preliminary mask patterns on the upper mask layer, each preliminary mask pattern having a first sidewall and a second sidewall, opposite the first sidewall, and forming upper mask patterns by etching the upper mask layer using the preliminary mask patterns as etch masks by controlling a first incident angle of a first ion beam incident on the first sidewall of each of the preliminary mask patterns and a second incident angle of a second ion beam incident on the second sidewalls of each of the preliminary mask patterns to project a shaded area onto which neither of the first and second ion beam are irradiated on the upper mask layer between the preliminary mask patterns.

BRIEF DESCRIPTION OF THE DRAWINGS

Features will become apparent to those of skill in the art by describing in detail exemplary embodiments with reference to the attached drawings in which:

FIGS. 6A to 11A illustrate views corresponding to a portion 'A' of FIG. 2 to illustrate methods of forming fine patterns, according to some embodiments.

FIGS. 6B to 11B illustrate views corresponding to a portion 'B' of FIG. 3 to illustrate methods of forming fine patterns

DETAILED DESCRIPTION

FIGS. 1 to 5 are cross-sectional views illustrating methods of forming fine patterns, according to some embodiments. FIGS. 6A to 11A are views corresponding to a portion 'A' of FIG. 2 to illustrate methods of forming fine patterns, according to some embodiments. FIGS. 6B to 11B are views corresponding to a portion 'B' of FIG. 3 to illustrate a method of forming fine patterns, according to some embodiments.

Figure 1:
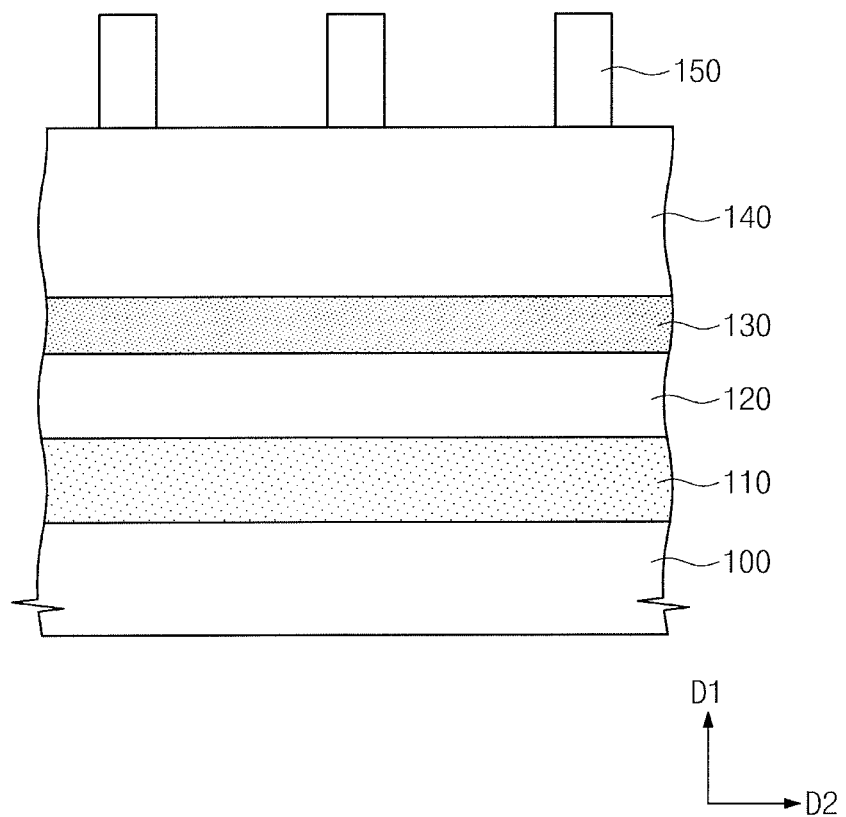
FIGS. 1 to 5 illustrate cross-sectional views of methods of forming fine patterns, according to some embodiments.

Referring to FIG. 1, an etch target layer 110, a lower mask layer 120, an upper mask layer 130, and a preliminary mask layer 140 may be sequentially formed on a substrate 100. The etch target layer 110, the lower mask layer 120, the upper mask layer 130, and the preliminary mask layer 140 may be sequentially stacked in a first direction D1 substantially perpendicular to a top surface of the substrate 100. The substrate 100 may be a semiconductor substrate (e.g., a silicon substrate, a germanium substrate, and/or a silicon-germanium substrate). The etch target layer 110 may include a conductive layer and/or an insulating layer. The lower mask layer 120 may include a material having an etch selectivity with respect to the etch target layer 110, and the upper mask layer 130 may include a material having an etch selectivity with respect to the lower mask layer 120. The preliminary mask layer 140 may include a material having an etch selectivity with respect to the upper mask layer 130.

Sacrificial patterns 150 may be formed on the preliminary mask layer 140. The sacrificial patterns 150 may be arranged in a second direction D2 parallel to the top surface of the substrate 100. In some embodiments, the sacrificial patterns 150 may have linear shapes extending in a direction which is parallel to the top surface of the substrate 100 and intersects the second direction D2. However, embodiments are not limited thereto. The sacrificial patterns 150 may be photoresist patterns or hard mask patterns. When the sacrificial patterns 150 are the hard mask patterns, the sacrificial patterns 150 may include an oxide (e.g., silicon oxide), a nitride (e.g., silicon nitride), and/or an oxynitride (e.g., silicon oxynitride), and may have an etch selectivity with respect to the preliminary mask layer 140. Forming the sacrificial patterns 150 may include performing a photolithography process using a photomask defining planar shapes of the sacrificial patterns 150.

Figure 2:
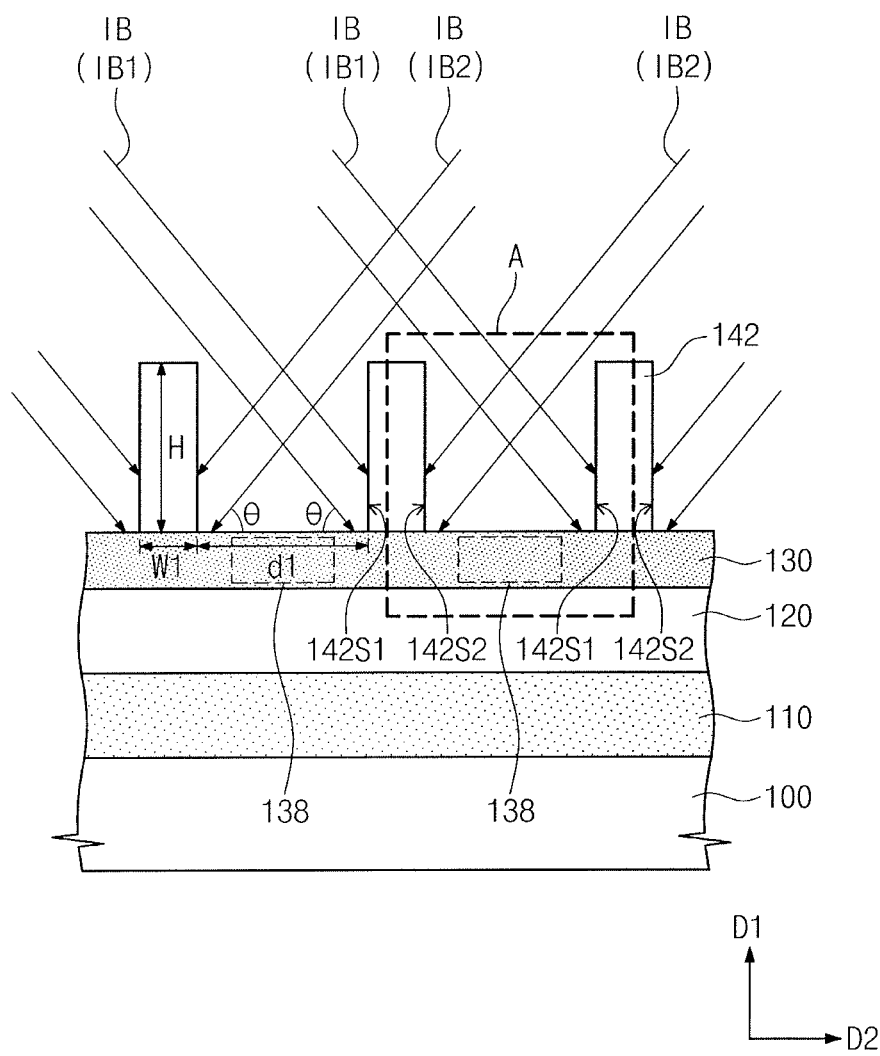

Referring to FIG. 2, the preliminary mask layer 140 may be etched using the sacrificial patterns 150 as etch masks to form preliminary mask patterns 142 on the upper mask layer 130. The preliminary mask patterns 142 may have linear shapes extending in the direction which is parallel to the top surface of the substrate 100 and intersects the second direction D2. However, embodiments are not limited thereto. The preliminary mask patterns 142 may be arranged in the second direction D2. Each of the preliminary mask patterns 142 may have a height H in the first direction D1 and a first width W1 in the second direction D2. The preliminary mask patterns 142 may be spaced apart from each other by a first distance d1 in the second direction D2. In other words, the preliminary mask patterns 142 may be arranged at the first distances d1 in the second direction D2. A pitch of the preliminary mask patterns 142 may be defined as a sum of the first width W1 and the first distance d1. Each of the preliminary mask patterns 142 may have a first sidewall 142S1 and a second sidewall 142S2 opposite each other. The first sidewall 142S1 of each of the preliminary mask patterns 142 may face the second sidewall 142S2 of the preliminary mask pattern 142 adjacent directly thereto. A top surface of the upper mask layer 130 may be exposed between the preliminary mask patterns 142.

An etching process using an ion beam IB may be performed on the substrate 100 having the preliminary mask patterns 142. During the etching process, the ion beam IB may be irradiated at an incident angle θ with respect to the top surface of the upper mask layer 130. The incident angle θ may be defined as an angle between the top surface of the substrate 100 (or the top surface of the upper mask layer 130) and an irradiation direction (or an incident direction) of the ion beam IB. The ion beam IB may include a first ion beam IB1 irradiated toward the first sidewall 142S1 of each of the preliminary mask patterns 142, and a second ion beam IB2 irradiated toward the second sidewall 142S2 of each of the preliminary mask patterns 142.

In some embodiments, the first ion beam IB1 and the second ion beam IB2 may be irradiated at the incident angles θ equal to each other with respect to the top surface of the upper mask layer 130. In other words, a magnitude of the incident angle θ of the first ion beam IB1 may be equal to a magnitude of the incident angle θ of the second ion beam IB2. In some embodiments, the substrate 100 may rotate on a rotation axis parallel to a normal line perpendicular to the top surface of the substrate 100 during the etching process. Thus the first ion beam IB1 and the second ion beam IB2 may be sequentially irradiated at the incident angle θ. In certain embodiments, the first ion beam IB1 and the second ion beam IB2 may be symmetrically irradiated at the incident angle θ at the same time during the etching process.

During the etching process, the upper mask layer 130 may have a shaded area 138 to which the ion beam IB is not irradiated between the preliminary mask patterns 142. The incident angle θ of the ion beam IB may be controlled or adjusted in such a way that the upper mask layer 130 may have the shaded area 138. In other words, by using preliminary mask patterns 142 on the upper mask layer 130, each having a first sidewall 142S1 and a second sidewall 142S2, opposite the first sidewall 142S1, and controlling a first incident angle of the first ion beam IB1 incident on the first sidewalls 142S1 of each of the preliminary mask patterns 142 and a second incident angle of the second ion beam IB2 incident on the second sidewalls 142S2 of each of the preliminary mask patterns 142, a shaded area 138 is projected onto which neither of the first and second ion beam are irradiated on the upper mask layer 130 between the preliminary mask patterns 142. As discussed in detail below, the first and second incident angles may be equal or different, such that the shaded area 138 maybe centered between adjacent preliminary mask patterns 142 or offset, e.g., along the second direction D2, between adjacent preliminary mask patterns 142.

Figure 6A:
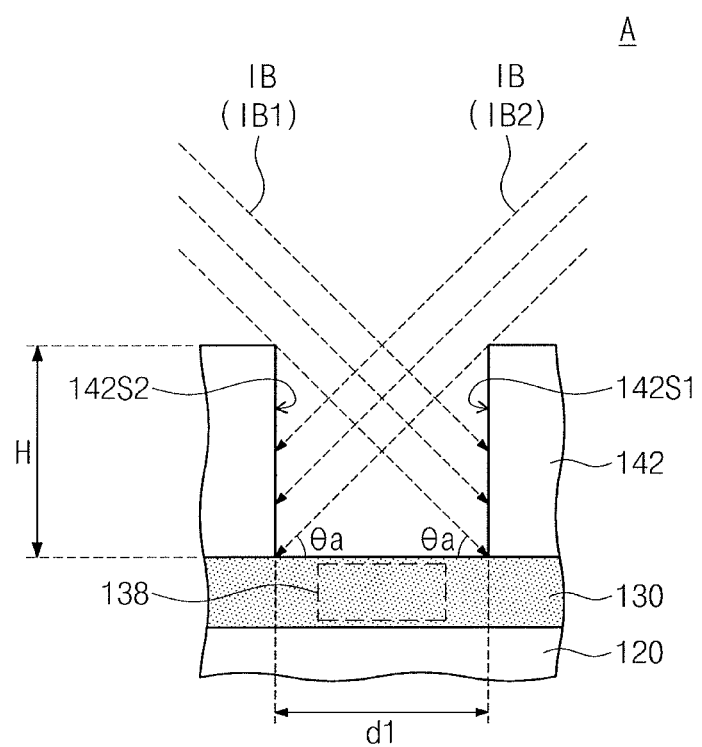

In detail, referring to FIG. 6A, when the ion beam IB is irradiated at a first incident angle θa, the first incident angle θa may be defined by the following equation 1.

$$\theta a = \arctan(H/d1) \quad \text{[Equation 1]}$$

Here, "θa" is the first incident angle θa, "H" is the height H of each of the preliminary mask patterns 142, and "d1" is the first distance d1 between the preliminary mask patterns 142. When the ion beam IB is irradiated at the first incident angle θa, the top surface of the upper mask layer 130 between the preliminary mask patterns 142 may be partially exposed to the ion beam IB. A portion of the ion beam IB irradiated toward the top surface of the upper mask layer 130 between the preliminary mask patterns 142 may be blocked by the preliminary mask patterns 142, and thus the upper mask layer 130 may have the shaded area 138 to which the ion beam IB is not irradiated between the preliminary mask patterns 142.

Figure 7A:
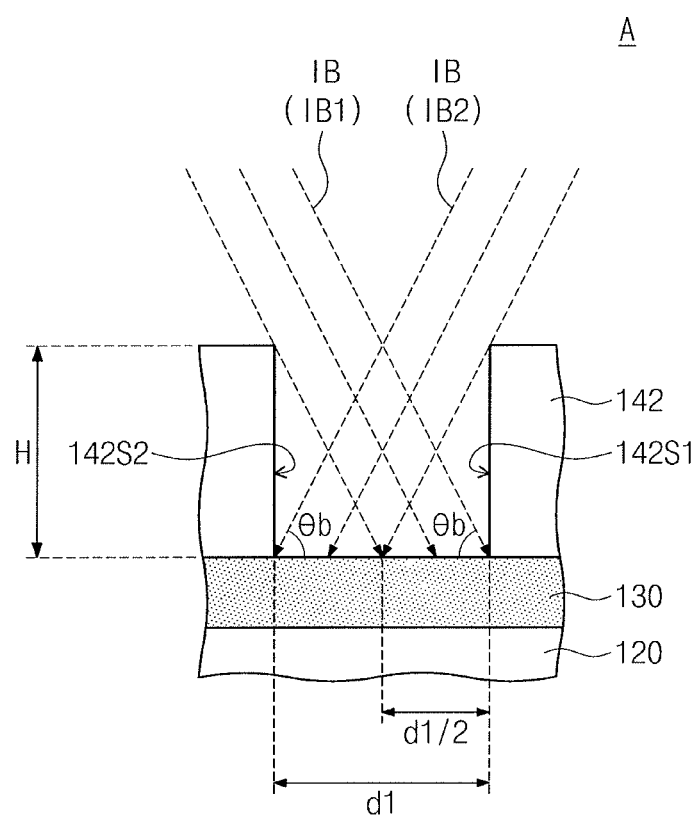

Referring to FIG. 7A, when the ion beam IB is irradiated at a second incident angle θb, the second incident angle θb may be defined by the following equation 2.

$$\theta b = \arctan((2 \times H)/d1) \quad \text{[Equation 2]}$$

Here, "θb" is the second incident angle θb, and "H" and "d1" are the same as defined in the equation 1. When the ion beam IB is irradiated at the second incident angle θb, the top surface of the upper mask layer 130 between the preliminary mask patterns 142 may be fully exposed to the ion beam IB. Thus, the upper mask layer 130 may not have the shaded area 138 between the preliminary mask patterns 142.

Referring again to FIG. 2, the incident angle θ of the ion beam IB may be equal to or greater than the first incident angle θa and less than the second incident angle θb (i.e., θa≤θ<θb). Thus, the upper mask layer 130 may have the shaded area 138 between the preliminary mask patterns 142 during the etching process.

Figure 3:
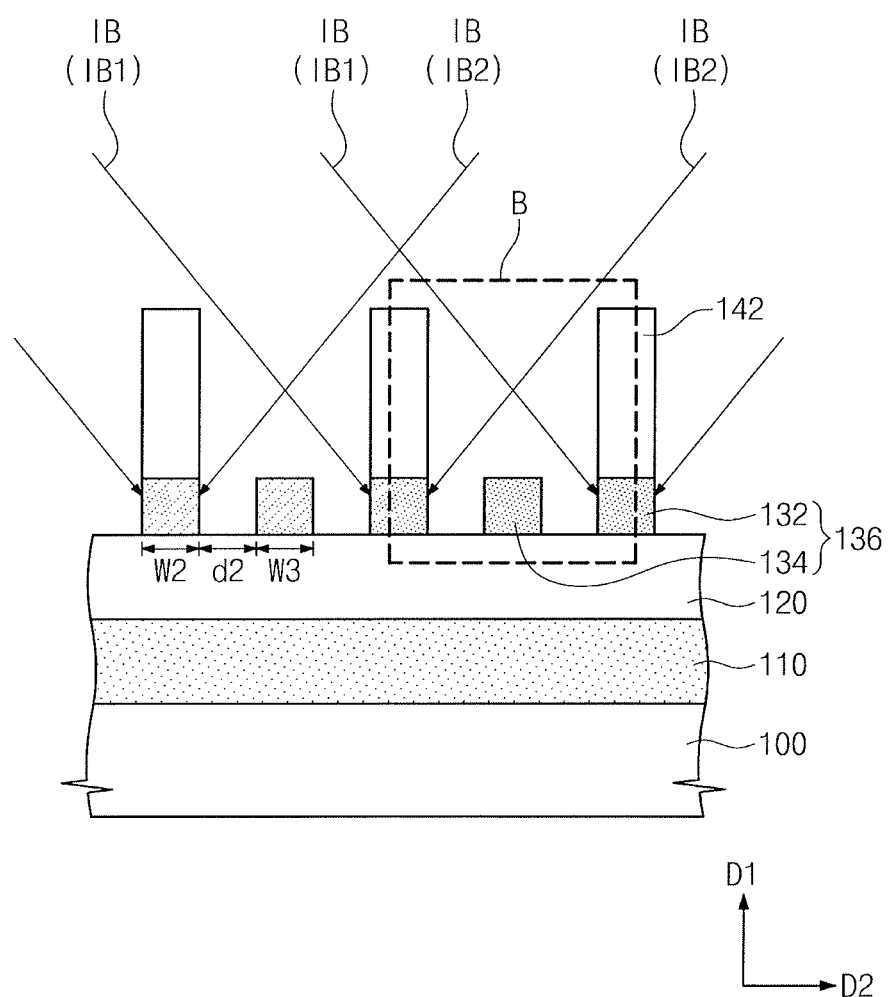

Referring to FIG. 3, the upper mask layer 130 may be patterned by the etching process to form upper mask patterns 136. The upper mask patterns 136 may include first upper mask patterns 132 respectively formed under the preliminary mask patterns 142 and second upper mask patterns 134 respectively formed between the preliminary mask patterns 142 in a plan view. In other words, each of the second upper mask patterns 134 may be formed between the first upper mask patterns 132.

The preliminary mask patterns 142 may be used as etch masks during the etching process. Thus, the first upper mask patterns 132 may be formed under the preliminary mask patterns 142, respectively. The upper mask layer 130 may have the shaded area 138 between the preliminary mask patterns 142, and the shaded area 138 may not be exposed to the ion beam IB. Thus, the shaded area 138 may not be etched by the etching process. As a result, at least a portion of the shaded area 138 of the upper mask layer 130 may not be removed by the etching process but may remain between the preliminary mask patterns 142 in a plan view (i.e., between the first upper mask patterns 132) to define each of the second upper mask patterns 134.

Figure 6B:
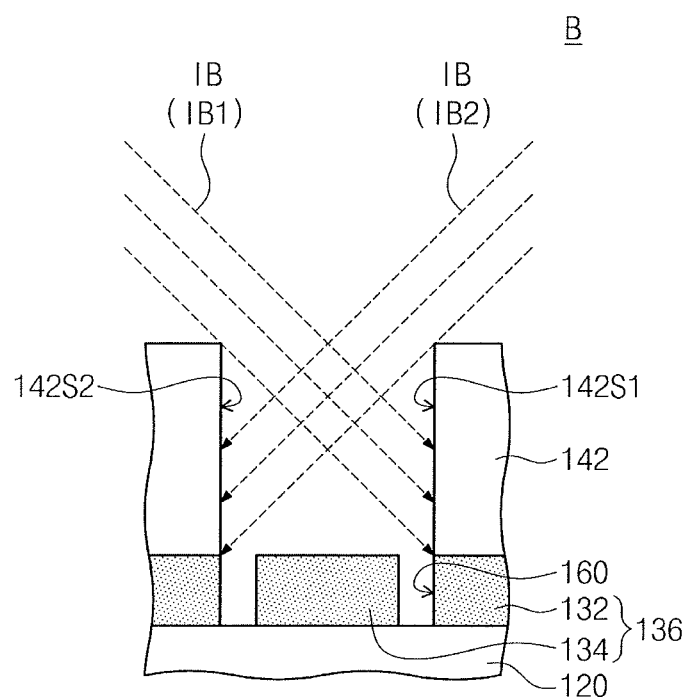

This will be described in more detail with reference to FIGS. 6A and 6B. When the ion beam IB is irradiated at the first incident angle θa, the upper mask layer 130 between the preliminary mask patterns 142 may include an area exposed to the ion beam IB and the shaded area 138 not exposed to the ion beam IB. The exposed area of the upper mask layer 130 may be etched by the etching process to form an opening 160 penetrating the upper mask layer 130. Since the ion beam IB includes the first ion beam IB1 irradiated toward the first sidewall 142S1 of each of the preliminary mask patterns 142 and the second ion beam IB2 irradiated toward the second sidewall 142S2 of each of the preliminary mask patterns 142, a pair of the openings 160 may be formed between the preliminary mask patterns 142.

An area of the upper mask layer 130, which is exposed to the first ion beam IB1, may be etched to form one of the pair of openings 160, and another area of the upper mask layer 130, which is exposed to the second ion beam IB2, may be etched to form the other of the pair of openings 160. The shaded area 138 may not be etched by the etching process but may remain between the preliminary mask patterns 142 in a plan view to define the second upper mask pattern 134. The second upper mask pattern 134 may have sidewalls defined by the pair of openings 160. The first upper mask pattern 132 may be spaced apart from the second upper mask pattern 134 by a corresponding one of the pair of openings 160.

Figure 7B:
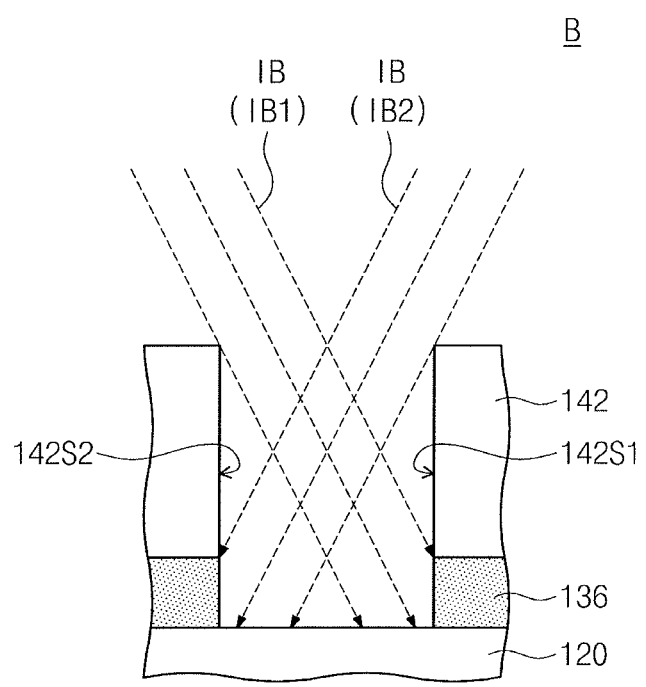

Referring to FIGS. 7A and 7B, when the ion beam IB is irradiated at the second incident angle $\theta b$, the top surface of the upper mask layer 130 between the preliminary mask patterns 142 may be fully exposed to the ion beam IB. Thus, the upper mask layer 130 between the preliminary mask patterns 142 may be etched by the etching process, and each of the upper mask patterns 136 may be locally formed under each of the preliminary mask patterns 142. In other words, the second upper mask patterns 134 may not be formed between the preliminary mask patterns 142 in a plan view, e.g., only the first upper mask patterns 132 may be formed.

Referring to FIGS. 2 and 3, since the incident angle $\theta$ of the ion beam IB is adjusted to be equal to or greater than the first incident angle $\theta a$ and less than the second incident angle $\theta b$ ($\theta a \leq \theta < \theta b$), the upper mask layer 130 may have the shaded area 138 between the preliminary mask patterns 142. The shaded area 138 may not be etched during the etching process but may remain to define the second upper mask pattern 134. Thus, the upper mask patterns 136 may include the first upper mask patterns 132 respectively disposed under the preliminary mask patterns 142 and the second upper mask patterns 134 each of which is disposed between the preliminary mask patterns 142 in a plan view.

Referring again to FIG. 3, the upper mask patterns 136 may be arranged in the second direction D2. The upper mask patterns 136 may have linear shapes extending in the direction which is parallel to the top surface of the substrate 100 and intersects the second direction D2. However, embodiments are not limited thereto. The upper mask patterns 136 may be spaced apart from each other by a second distance d2 in the second direction D2. For example, the upper mask patterns 136 may be arranged at the second distances d2 in the second direction D2. The second upper mask pattern 134 may be spaced apart from the first upper mask pattern 132 by the second distance d2 in the second direction D2. The first upper mask pattern 132 may have a second width W2 in the second direction D2, and the second upper mask pattern 134 may have a third width W3 in the second direction D2. The second width W2 may be equal to or different from the third width W3. A pitch of the upper mask patterns 136 may be defined as a sum of the second width W2 and the second distance d2 or a sum of the third width W3 and the second distance d2. The pitch of the upper mask patterns 136 may be smaller than the pitch of the preliminary mask patterns 142. A top surface of the lower mask layer 120 may be exposed between the upper mask patterns 136.

In some embodiments, the incident angle $\theta$ of the ion beam IB may be adjusted or controlled to adjust the second distance d2 between the upper mask patterns 136 and the third width W3 of the second upper mask pattern 134. In more detail, referring to FIG. 8A, a size of the shaded area 138 may decrease (i.e., S1>S2>S3) as the incident angle $\theta$ of the ion beam IB increases (i.e., $\theta 1 < \theta 2 < \theta 3$, where $\theta a \leq \theta 1$ and $\theta 3 < \theta b$). Thus, a size of the area, exposed to the ion beam IB between the preliminary mask patterns 142, of the upper mask layer 130 may increase.

Figure 8A:
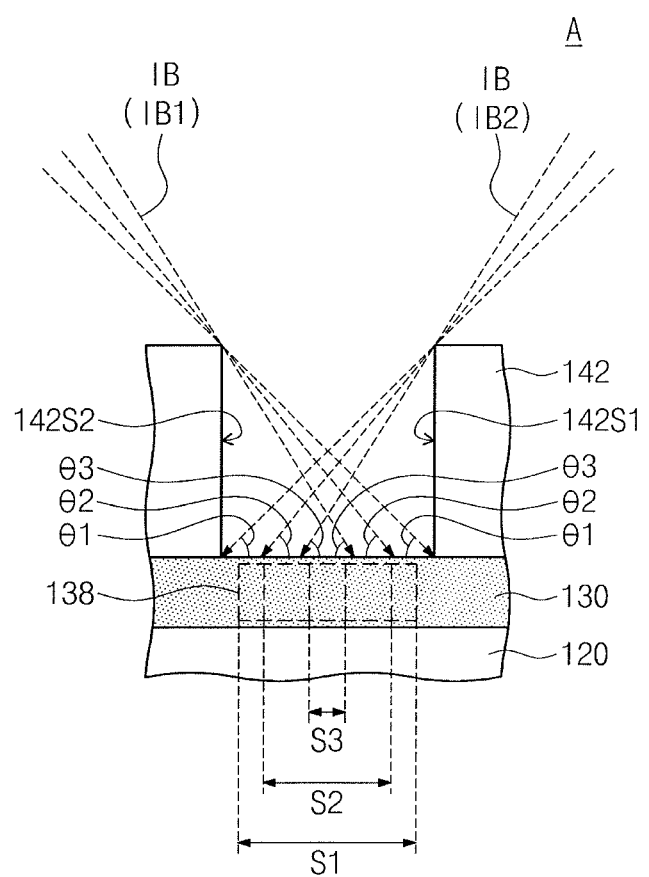
Figure 8B:
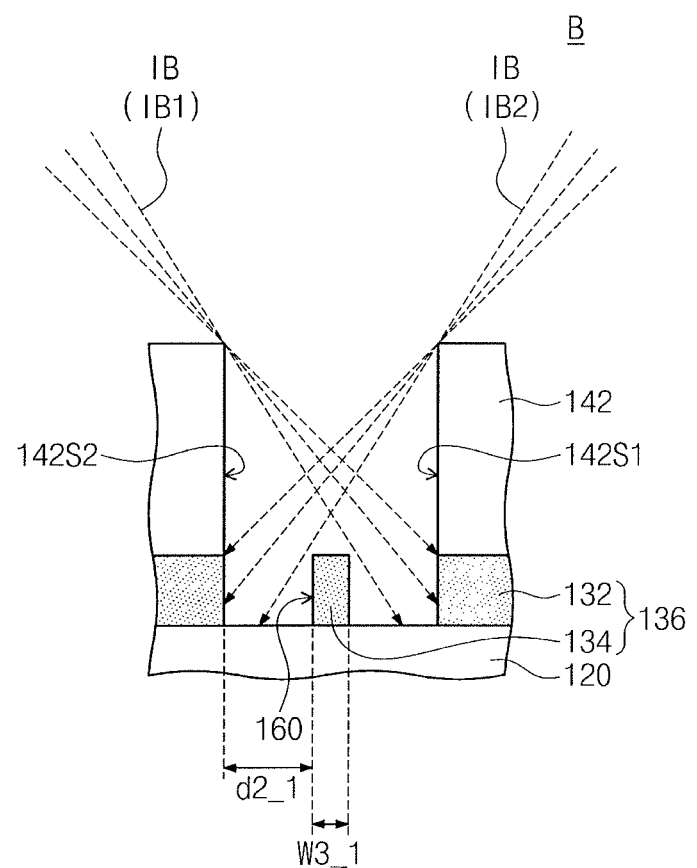

Referring to FIG. 8B, the exposed area of the upper mask layer 130 may be etched by the etching process, and thus the opening 160 may be formed to penetrate the upper mask layer 130. Since the ion beam IB includes the first ion beam IB1 and the second ion beam IB2 the pair of openings 160 may be formed between the preliminary mask patterns 142. An area of the upper mask layer 130, which is exposed to the first ion beam IB1, may be etched to form one of the pair of openings 160, and another area of the upper mask layer 130, which is exposed to the second ion beam IB2, may be etched to form the other of the pair of openings 160. The second distance d2 between the upper mask patterns 136 may correspond to a width of each of the pair of openings 160.

The width of each of the pair of openings 160 may increase as the incident angle $\theta$ of the ion beam IB increases (i.e., $\theta 1 < \theta 2 < \theta 3$, where $\theta a \leq \theta 1$ and $\theta 3 < \theta b$), and thus the second distance d2 between the upper mask patterns 136 may increase (i.e., d2<d2_1). The shaded area 138 may not be etched by the etching process but may remain between the preliminary mask patterns 142 in a plan view to define the second upper mask pattern 134. The second upper mask pattern 134 may have sidewalls defined by the pair of openings 160. The size of the shaded area 138 may decrease (i.e., S1>S2>S3) as the incident angle $\theta$ of the ion beam IB increases (i.e., $\theta 1 < \theta 2 < \theta 3$, where $\theta a \leq \theta 1$ and $\theta 3 < \theta b$), and thus the third width W3 of the second upper mask pattern 134 may be reduced (i.e., W3>W3_1).

Referring again to FIGS. 2 and 3, the etching process may be an ion beam etching process that uses an inert gas or a reactive gas as an ion source. In some embodiments, the etching process may use the inert gas (e.g., an argon gas) as the ion source. In this case, the preliminary mask patterns 142 may include a material of which an interatomic bonding strength is stronger than that of the upper mask layer 130. For example, the preliminary mask patterns 142 may include a metal material (e.g., tungsten) formed of a single atom, and the upper mask layer 130 may include at least one of a semiconductor material (e.g., silicon) or a compound (e.g., an oxide, a nitride, and/or an oxynitride) formed of different kinds of atoms. Since the preliminary mask patterns 142 includes the material of which the interatomic bonding strength is stronger than that of the upper mask layer 130, the preliminary mask patterns 142 may have an etch selectivity with respect to the upper mask layer 130 during the etching process.

In certain embodiments, the etching process may use the reactive gas (e.g., an oxygen gas or a carbon tetrafluoride ($CF_4$) gas) as the ion source. In this case, the preliminary mask patterns 142 may include a material of which reactivity with ions generated from the reactive gas is lower than that of the upper mask layer 130. Thus, the preliminary mask patterns 142 may have an etch selectivity with respect to the upper mask layer 130 during the etching process. For example, the upper mask layer 130 may include at least one of silicon, carbon-containing silicon, an oxide, a nitride, or an oxynitride. In this case, the preliminary mask patterns 142 may include a material which includes at least one of silicon, carbon-containing silicon, an oxide, a nitride, or an oxynitride and has an etch selectivity with respect to the upper mask layer 130.

In some embodiments, when the etching process is the ion beam etching process using the inert gas (e.g., an argon gas) as the ion source, at least one of an ion energy, an ion current, or an irradiation time of the ion beam IB may be adjusted or controlled to adjust the second distance d2 between the upper mask patterns 136 and the third width W3 of the second upper mask pattern 134.

Figure 9A:
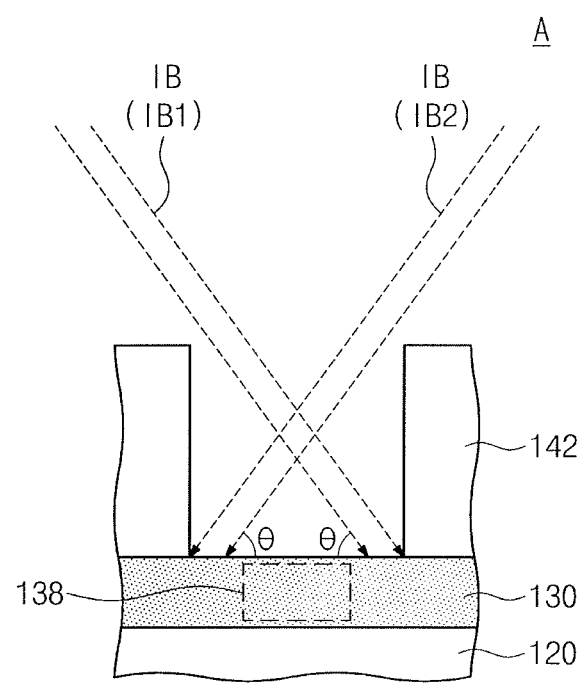

In detail, referring to FIG. 9A, when the ion beam IB is irradiated at the incident angle θ, the upper mask layer 130 may be partially exposed to the ion beam IB between the preliminary mask patterns 142 even though at least one of the ion energy, the ion current, or the irradiation time of the ion beam IB is changed. In other words, the upper mask layer 130 may include the area exposed to the ion beam IB and the shaded area 138 between the preliminary mask patterns 142.

Figure 9B:
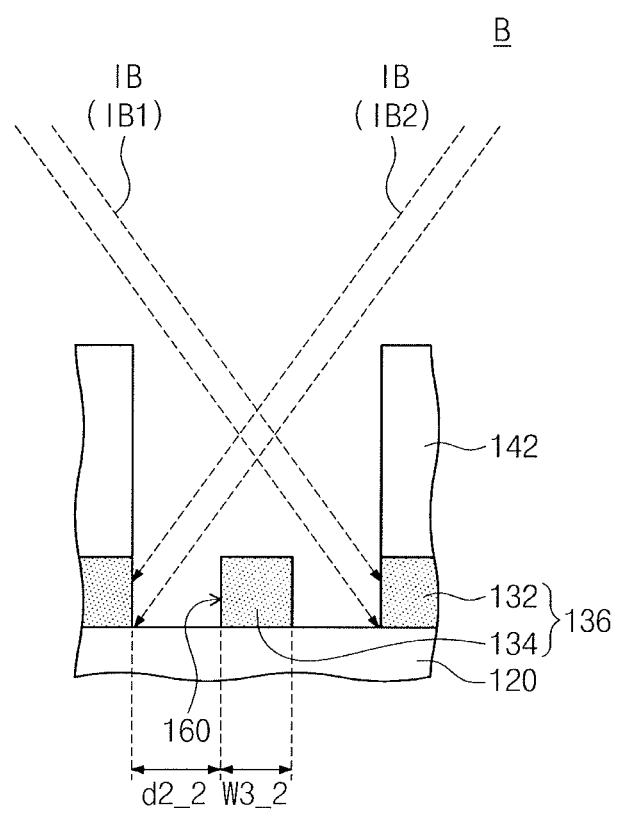

Referring to FIG. 9B, the exposed area of the upper mask layer 130 may be etched by the etching process. Thus, the opening 160 may be formed to penetrate the upper mask layer 130. Since the ion beam IB includes the first ion beam IB1 and the second ion beam IB2, the pair of openings 160 may be formed between the preliminary mask patterns 142. The second distance d2 between the upper mask patterns 136 may correspond to a width of each of the pair of openings 160. When the etching process uses the inert gas (e.g., the argon gas) as the ion source, a loss of the preliminary mask patterns 142 may occur during the etching process by physical etching characteristics of the etching process. In this case, a loss of the sidewalls of the preliminary mask patterns 142 may increase as at least one of the ion energy, the ion current, or the irradiation time of the ion beam IB increases, and thus the width of each of the pair of openings 160 may increase.

In other words, the second distance d2 between the upper mask patterns 136 may increase (i.e., d2<d2_2) as at least one of the ion energy, the ion current, or the irradiation time of the ion beam IB increases. The shaded area 138 may not be etched by the etching process but may remain between the preliminary mask patterns 142 in a plan view to define the second upper mask pattern 134. The second upper mask pattern 134 may have sidewalls defined by the pair of openings 160. The third width W3 of the second upper mask pattern 134 may be reduced (i.e., W3>W3_2) or remain substantially constant (i.e., W3≈W3_2) as at least one of the ion energy, the ion current, or the irradiation time of the ion beam IB increases.

In some embodiments, the first ion beam IB1 and the second ion beam IB2 may be controlled to be irradiated at incident angles different from each other. Thus, the second distance d2 between the upper mask patterns 136 and the third width W3 of the second upper mask pattern 134 may be adjusted.

Figure 10A:
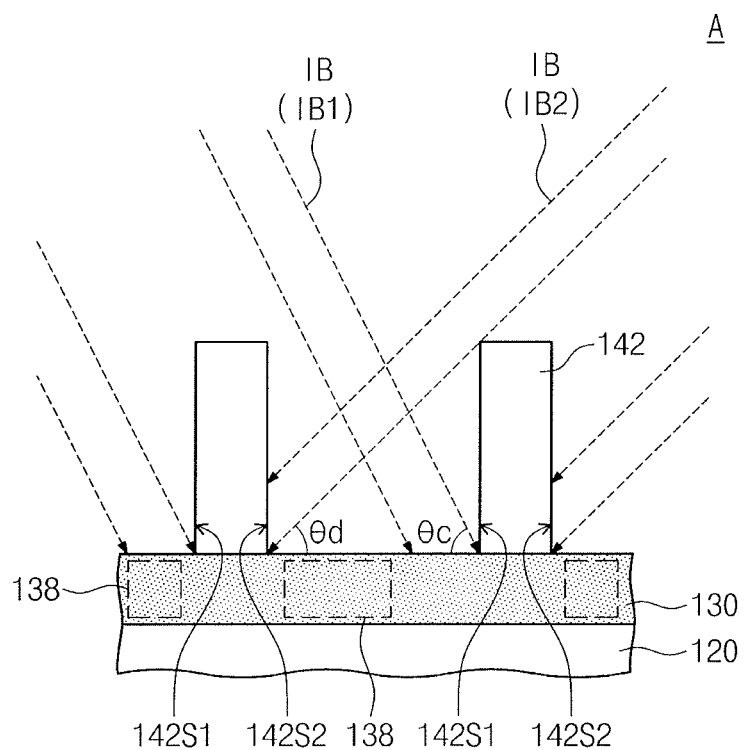

In detail, referring to FIG. 10A, the first ion beam IB1 may be irradiated at a third incident angle θc with respect to the top surface of the upper mask layer 130, and the second ion beam IB2 may be irradiated at a fourth incident angle θd with respect to the top surface of the upper mask layer 130. Each of the third and fourth incident angles θc and θd may be equal to or greater than the first incident angle θa and less than the second incident angle θb (i.e., θa≤θc<θb and θa≤θd<θb) as described with reference to FIGS. 6A and 7A, and the third incident angle θc may be different from the fourth incident angle θd (i.e., θc≠θd). The third incident angle θc and the fourth incident angle θd may be adjusted in such a way that the upper mask layer 130 may have the shaded area 138 between the preliminary mask patterns 142.

Figure 10B:
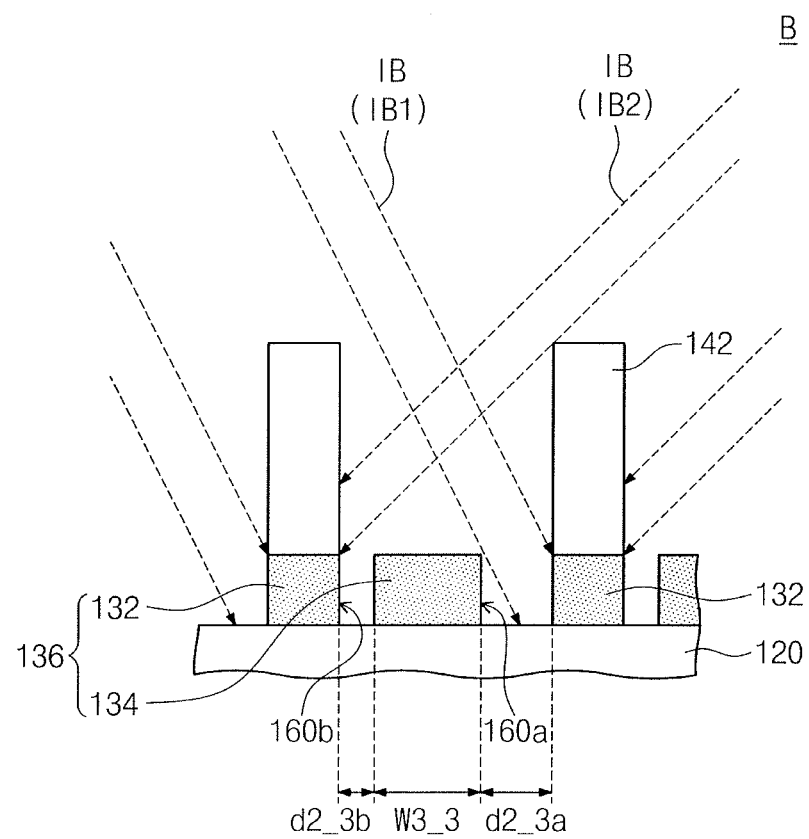

Referring to FIG. 10B, an area of the upper mask layer 130, which is exposed to the first ion beam IB1 between the preliminary mask patterns 142, may be etched by the etching process to form a first opening 160a. Another area of the upper mask layer 130, which is exposed to the second ion beam IB2 between the preliminary mask patterns 142, may be etched by the etching process to form a second opening 160b. The shaded area 138 may not be etched by the etching process but may remain between the preliminary mask patterns 142 in a plan view to define the second upper mask pattern 134. The second upper mask pattern 134 may have sidewalls defined by the first opening 160a and the second opening 160b. The first upper mask pattern 132 may be spaced apart from the second upper mask pattern 134 by a corresponding one of the first and second openings 160a and 160b. A distance d2_3a between the first and second upper mask patterns 132 and 134 spaced apart from each other by the first opening 160a may correspond to a width of the first opening 160a. A distance d2_3b between the first and second upper mask patterns 132 and 134 spaced apart from each other by the second opening 160b may correspond to a width of the second opening 160b.

Since the first ion beam IB1 and the second ion beam IB2 are irradiated at the third incident angle θc and the fourth incident angle θd different from each other, respectively, the width of the first opening 160a may be different from the width of the second opening 160b. In other words, the distance d2_3a between the first and second upper mask patterns 132 and 134 spaced apart from each other by the first opening 160a may be different from the distance d2_3b between the first and second upper mask patterns 132 and 134 spaced apart from each other by the second opening 160b. As a result, the first ion beam IB1 and the second ion beam IB2 may be controlled to be irradiated respectively at the incident angles different from each other, and thus the second distance d2 between the upper mask patterns 136 may be variously adjusted. The first upper mask pattern 132 may have the second width W2, as described with reference to FIG. 3.

Since the first ion beam IB1 and the second ion beam IB2 are controlled to be irradiated at the third incident angle θc and the fourth incident angle θd different from each other, respectively, the third width W3 of the second upper mask pattern 134 may be adjusted. The third incident angle θc and the fourth incident angle θd may be controlled in such a way that the second upper mask pattern 134 has a width W3_3 different from the second width W2 of the first upper mask pattern 132. In this case, since the first and second ion beams IB1 and IB2 are controlled to be irradiated respectively at the incident angles different from each other, the upper mask patterns 136 may include the first upper mask pattern 132 and the second upper mask pattern 134 which have the widths different from each other.

In some embodiments, when the etching process is the ion beam etching process using the inert gas (e.g., the argon gas) as the ion source, the first and second ion beams IB1 and IB2 may be controlled to be irradiated respectively at the incident angles equal to each other, and at least one of an ion energy, an ion current, or an irradiation time of the first ion beam IB1 may be different from corresponding one(s) of an ion energy, an ion current, or an irradiation time of the second ion beam IB2.

Figure 11A:
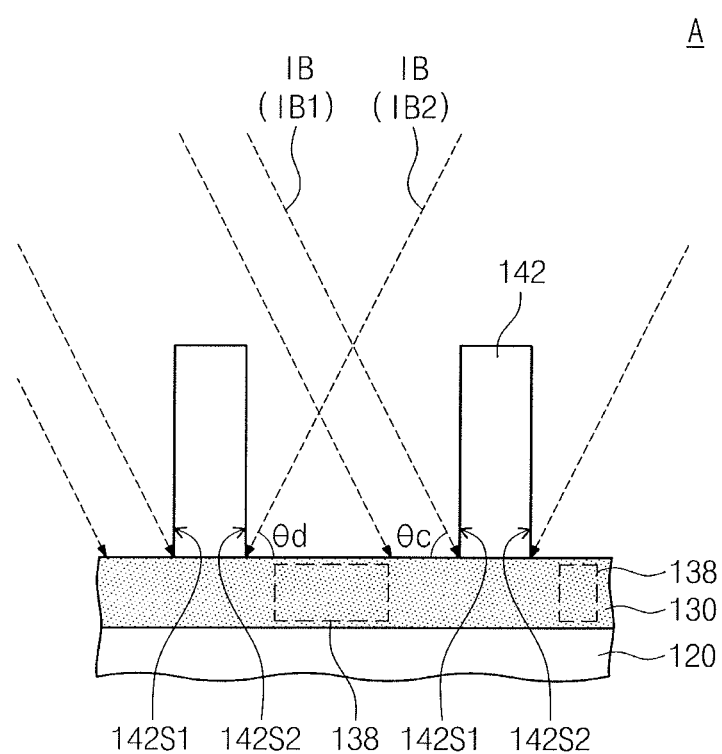

In detail, referring to FIG. 11A, the first ion beam IB1 may be irradiated at the third incident angle θc with respect to the top surface of the upper mask layer 130, and the second ion beam IB2 may be irradiated at the fourth incident angle θd with respect to the top surface of the upper mask layer 130. Each of the third and fourth incident angles θc and θd may be equal to or greater than the first incident angle θa and less than the second incident angle θb (i.e., θa≤θc<θb and θa≤θd<θb), as described with reference to FIGS. 6A and 7A. Unlike the descriptions of FIGS. 10A and 10B, according to the present embodiment, the third incident angle θc and the fourth incident angle θd may be equal to each other (i.e., θc=θd), and at least one of the ion energy, the ion current, or the irradiation time of the first ion beam IB1 may be different from corresponding one(s) of the ion energy, the ion current, or the irradiation time of the second ion beam IB2. The third incident angle θc and the fourth incident angle θd may be adjusted in such a way that the upper mask layer 130 may have the shaded area 138 between the preliminary mask patterns 142.

Figure 11B:
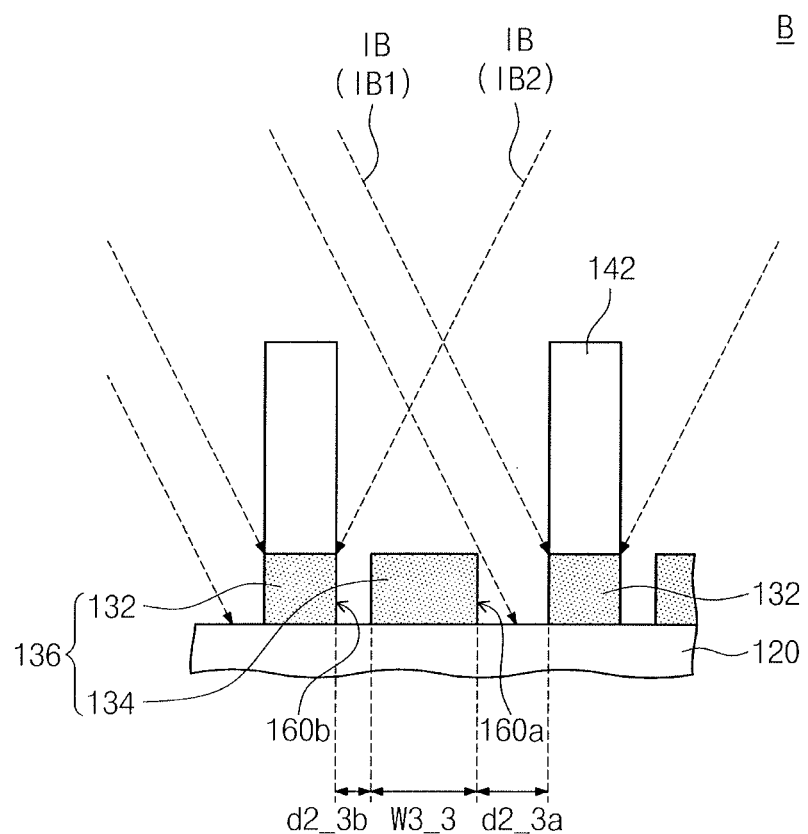

Referring to FIG. 11B, since at least one of the ion energy, the ion current, or the irradiation time of the first ion beam IB1 is controlled to be different from the corresponding one(s) of the ion energy, the ion current, or the irradiation time of the second ion beam IB2, the first and second openings 160a and 160b may be formed to have widths different from each other, as described with reference to FIGS. 10A and 10B. Thus, the second distance d2 between the upper mask patterns 136 may be variously adjusted. In this case, the second upper mask pattern 134 may have a width W3_3 different from the second width W2 of the first upper mask pattern 132, and thus the upper mask patterns 136 may include the first upper mask pattern 132 and the second upper mask pattern 134 which have the widths different from each other.

Figure 4:
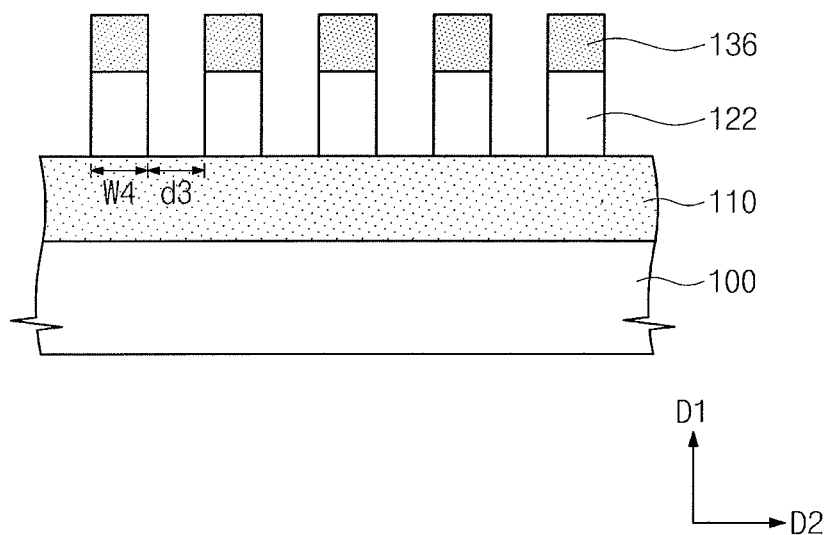

Referring to FIG. 4, the preliminary mask patterns 142 may be removed after the formation of the upper mask patterns 136. The removal of the preliminary mask patterns 142 may include performing an etching process having an etch selectivity with respect to the upper mask patterns 136 and the lower mask layer 120. The lower mask layer 120 may be etched using the upper mask patterns 136 as etch masks to form lower mask patterns 122. The lower mask patterns 122 may have linear shapes extending in the direction which is parallel to the top surface of the substrate 100 and intersects the second direction D2. However, embodiments are not limited thereto.

Each of the lower mask patterns 122 may have a fourth width W4 in the second direction D2. The lower mask patterns 122 may be spaced apart from each other by a third distance d3 in the second direction D2. In other words, the lower mask patterns 122 may be arranged at the third distances d3 in the second direction D2. A pitch of the lower mask patterns 122 may be defined as a sum of the fourth width W4 and the third distance d3. The pitch of the lower mask patterns 122 may be substantially equal to the pitch of the upper mask patterns 136.

Figure 5:
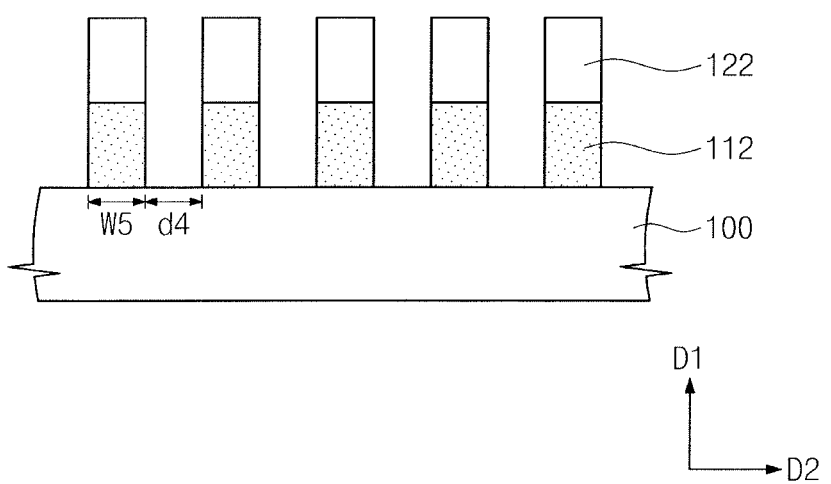

Referring to FIG. 5, the etch target layer 110 may be etched using the lower mask patterns 122 as etch masks to form patterns 112. In some embodiments, the upper mask patterns 136 may be lost or removed during an etching process for forming the patterns 112. In certain embodiments, an additional process may be performed to remove the upper mask patterns 136 before the etching process for forming the patterns 112. The additional process may include an etching process having an etch selectivity with respect to the lower mask patterns 122 and the etch target layer 110. The patterns 112 may have linear shapes extending in the direction which is parallel to the top surface of the substrate 100 and intersects the second direction D2. However, embodiments are not limited thereto.

Each of the patterns 112 may have a fifth width W5 in the second direction D2. The patterns 112 may be spaced apart from each other by a fourth distance d4 in the second direction D2. In other words, the patterns 112 may be arranged at the fourth distances d4 in the second direction D2. A pitch of the patterns 112 may be defined as a sum of the fifth width W5 and the fourth distance d4. The pitch of the patterns 112 may be substantially equal to the pitch of the lower mask patterns 122. The pitch of the patterns 112 may be smaller than the pitch of the preliminary mask patterns 142 described with reference to FIG. 2.

According to the aforementioned embodiments, the etching process using the ion beam may be performed on the substrate on which the preliminary mask patterns are formed. The preliminary mask patterns may be used as etch masks during the etching process, and the upper mask layer may be etched by the etching process to form the upper mask patterns. The incident angle of the ion beam may be adjusted during the etching process, and thus the upper mask patterns may have a smaller pitch than the preliminary mask patterns. In other words, the upper mask patterns may include the first upper mask patterns respectively formed under the preliminary mask patterns and the second upper mask patterns each of which is formed between the preliminary mask patterns in a plan view. Thereafter, underlying layers may be etched using the upper mask patterns as etch masks to form patterns having a fine pitch. Since the upper mask patterns are formed by the etching process to have the smaller pitch than the preliminary mask patterns, the processes of forming the patterns having the fine pitch may be simplified. In addition, at least one of the incident angle, the ion current, the ion energy, or the irradiation time of the ion beam may be controlled during the etching process to easily adjust the pitch of the upper mask patterns. As a result, it is possible to easily adjust the pitch of the patterns formed using the upper mask patterns as etch masks.

According to some embodiments, the etching process using the ion beam may be performed on the substrate having the preliminary mask patterns to form the upper mask patterns having a smaller pitch than the preliminary mask patterns. Fine patterns may be formed by etching underlying layers using the upper mask patterns as etch masks. The upper mask patterns may have the smaller pitch than the preliminary mask patterns by the etching process, and thus processes of forming the fine patterns may be simplified.

In addition, the pitch of the upper mask patterns may be easily adjusted by controlling at least one of the incident angle, the ion current, the ion energy, or the irradiation time of the ion beam during the etching process, and thus the pitch of the fine patterns may be easily adjusted or controlled.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming fine patterns, the method comprising:
   forming an upper mask layer on a substrate;
   forming preliminary mask patterns on the upper mask layer; and
   forming upper mask patterns by etching the upper mask layer using the preliminary mask patterns as etch masks,
   wherein forming the upper mask patterns includes etching the upper mask layer by performing an etching process using an ion beam, and
   wherein the upper mask patterns include a first upper mask pattern and a second mask pattern formed simultaneously by the etching process, the first upper mask pattern vertically overlaps each of the preliminary mask patterns; and the second upper mask pattern is laterally spaced apart from the first upper mask pattern.

2. The method as claimed in claim 1, further comprising controlling an incident angle of the ion beam during the etching process to project a shaded area onto which the ion beam is not irradiated on the upper mask layer between the preliminary mask patterns.

3. The method as claimed in claim 2, wherein at least a portion of the shaded area of the upper mask layer is not removed by the etching process to define the second upper mask pattern.

4. The method as claimed in claim 1, wherein an incident angle of the ion beam is equal to or greater than a first angle and less than a second angle during the etching process, and
   wherein the first angle and the second angle are defined by the following equation 1 and the following equation 2, respectively, $$\theta a = \arctan(H/d1) \qquad \text{[Equation 1]}$$

$$\theta b = \arctan((2 \times H)/d1) \qquad \text{[Equation 2]}$$

where "$\theta a$" and "$\theta b$" are the first angle and the second angle, respectively, "H" is a height of each of the preliminary mask patterns, and "d1" is a distance between the preliminary mask patterns.

5. The method as claimed in claim 1, wherein:
   etching the upper mask layer includes forming a pair of openings penetrating the upper mask layer between a pair of the preliminary mask patterns adjacent to each other, and
   the second upper mask pattern has sidewalls defined by the pair of openings.

6. The method as claimed in claim 5, wherein the first upper mask pattern is spaced apart from the second upper mask pattern by a corresponding one of the pair of openings.

7. The method as claimed in claim 6, wherein:
   each of the pair of openings has a width in a direction parallel to a top surface of the substrate, and
   etching the upper mask layer includes controlling at least one of an incident angle, an ion energy, an ion current, or an irradiation time of the ion beam to adjust the width of each of the pair of openings.

8. The method as claimed in claim 5, wherein:
   each of the preliminary mask patterns has a first sidewall and a second sidewall opposite to each other, the first sidewall of each of the preliminary mask patterns faces the second sidewall of the preliminary mask pattern adjacent directly to each of the preliminary mask patterns,
   the ion beam includes
      a first ion beam irradiated toward the first sidewall of each of the preliminary mask patterns, and
      a second ion beam irradiated toward the second sidewall of each of the preliminary mask patterns,
   each of the pair of openings has a width in a direction parallel to a top surface of the substrate,
   etching the upper mask layer includes controlling the first and second ion beams to have at least one of an incident angle, an ion energy, an ion current, or an irradiation time different from one another to adjust widths of the pair of openings to be different from one another.

9. The method as claimed in claim 1, wherein etching the upper mask layer includes using an inert gas as an ion source.

10. The method as claimed in claim 9, wherein the preliminary mask patterns include a material having an interatomic bonding strength stronger than that of the upper mask layer.

11. The method as claimed in claim 1, wherein:
    etching the upper mask layer includes using a reactive gas as an ion source, and
    the preliminary mask patterns include a material having an etch selectivity with respect to the upper mask layer.

12. The method as claimed in claim 1, further comprising:
    forming an etch target layer between the substrate and the upper mask layer;
    forming a lower mask layer between the etch target layer and the upper mask layer;
    etching the lower mask layer using the upper mask patterns as etch masks to form lower mask patterns; and
    etching the etch target layer using the lower mask patterns as etch masks to form patterns.

13. The method as claimed in claim 1, wherein a pitch of the upper mask patterns is smaller than a pitch of the preliminary mask patterns.

14. A method of forming fine patterns, the method comprising:
    forming an upper mask layer on a substrate;
    forming preliminary mask patterns on the upper mask layer; and
    forming upper mask patterns by etching the upper mask layer using the preliminary mask patterns as etch masks,
    wherein forming the upper mask patterns includes etching the upper mask layer using an ion beam and controlling an incident angle of the ion beam during etching to project a shaded area onto which the ion beam is not irradiated on the upper mask layer between the preliminary mask patterns.

15. The method as claimed in claim 14, wherein the incident angle of the ion beam is equal to or greater than a first angle and less than a second angle, and
    wherein the first angle and the second angle are defined by the following equation 1 and the following equation 2, respectively, $$\theta a = \arctan(H/d1) \qquad \text{[Equation 1]}$$

$$\theta b = \arctan((2 \times H)/d1) \qquad \text{[Equation 2]}$$

where "$\theta a$" and "$\theta b$" are the first angle and the second angle, respectively, "H" is a height of each of the preliminary mask patterns, and "d1" is a distance between the preliminary mask patterns.

16. The method as claimed in claim 15, wherein each of the preliminary mask patterns has a first sidewall and a second sidewall opposite to each other,
   wherein the first sidewall of each of the preliminary mask patterns faces the second sidewall of the preliminary mask pattern adjacent directly to each of the preliminary mask patterns,
   wherein the ion beam includes a first ion beam irradiated toward the first sidewall of each of the preliminary mask patterns; and a second ion beam irradiated toward the second sidewall of each of the preliminary mask patterns,
   wherein an incident angle of each of the first and second ion beams is equal to or greater than the first angle and less than the second angle.

17. The method as claimed in claim 14, wherein:
   the upper mask patterns includes a first upper mask pattern formed under each of the preliminary mask patterns and a second upper mask pattern formed between the preliminary mask patterns in a plan view, and
   at least a portion of the shaded area of the upper mask layer is not removed by etching but remains between the preliminary mask patterns in a plan view to define the second upper mask pattern.

18. The method as claimed in claim 17, wherein the first upper mask pattern and the second upper mask pattern are spaced apart from each other in a direction parallel to a top surface of the substrate.

19. The method as claimed in claim 18, wherein the first upper mask pattern and the second upper mask pattern are alternately and repeatedly arranged in the direction parallel to the top surface of the substrate.

20. A method of forming fine patterns, the method comprising:
   forming an upper mask layer on a substrate;
   forming preliminary mask patterns on the upper mask layer, each preliminary mask pattern having a first sidewall and a second sidewall, opposite the first sidewall; and
   forming upper mask patterns by etching the upper mask layer using the preliminary mask patterns as etch masks by controlling a first incident angle of a first ion beam incident on the first sidewall of each of the preliminary mask patterns and a second incident angle of a second ion beam incident on the second sidewalls of each of the preliminary mask patterns to project a shaded area onto which neither of the first and second ion beam are irradiated on the upper mask layer between the preliminary mask patterns.

* * * * *